United States Patent
Choi et al.

(10) Patent No.: US 7,601,621 B2
(45) Date of Patent: Oct. 13, 2009

(54) METHOD OF FORMING SURFACE IRREGULARITIES AND METHOD OF MANUFACTURING GALLIUM NITRIDE-BASED LIGHT EMITTING DIODE

(75) Inventors: Pun Jae Choi, Yongin (KR); Masayoshi Koike, Suwon (KR); Lee Jong Ho, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/798,083

(22) Filed: May 10, 2007

(65) Prior Publication Data

US 2008/0044937 A1     Feb. 21, 2008

(30) Foreign Application Priority Data

Aug. 17, 2006     (KR)     ............... 10-2006-0077677

(51) Int. Cl.
*H01L 21/265*     (2006.01)
(52) U.S. Cl. ................ 438/518; 438/46; 438/47; 438/590; 438/700; 438/745; 438/767
(58) Field of Classification Search ........... 438/46, 438/47, 518, 590, 700, 745, 767, 942, FOR. 157, 438/FOR. 394

See application file for complete search history.

(56) References Cited

U.S. PATENT DOCUMENTS

| 5,214,306 A | 5/1993 | Hashimoto | |
| 2002/0177247 A1* | 11/2002 | Kwak et al. | 438/22 |
| 2007/0262428 A1* | 11/2007 | Summers | 257/678 |
| 2007/0267640 A1* | 11/2007 | Lee et al. | 257/94 |

FOREIGN PATENT DOCUMENTS

| JP | 2004-71657 A | 3/2004 |
| KR | 10-2005-0045042 | 5/2005 |
| KR | 10-2005-0097075 A | 7/2005 |

* cited by examiner

*Primary Examiner*—N Drew Richards
*Assistant Examiner*—Joannie A Garcia
(74) *Attorney, Agent, or Firm*—McDermott Will & Emery LLP

(57) ABSTRACT

A method of forming surface irregularities comprises preparing a GaN substrate; forming a mask on a surface of the GaN substrate, the mask defining a surface-irregularity formation region; and wet-etching portions of the surface of the GaN substrate by using the mask as an etching mask. The wet-etching of the GaN substrate is performed until the end of one surface of the GaN substrate to be formed by the wet-etching using the mask meets the end of another surface of the GaN substrate to be formed by the wet-etching using the mask, the another surface being adjacent to the one surface.

3 Claims, 7 Drawing Sheets

[FIG. 1]
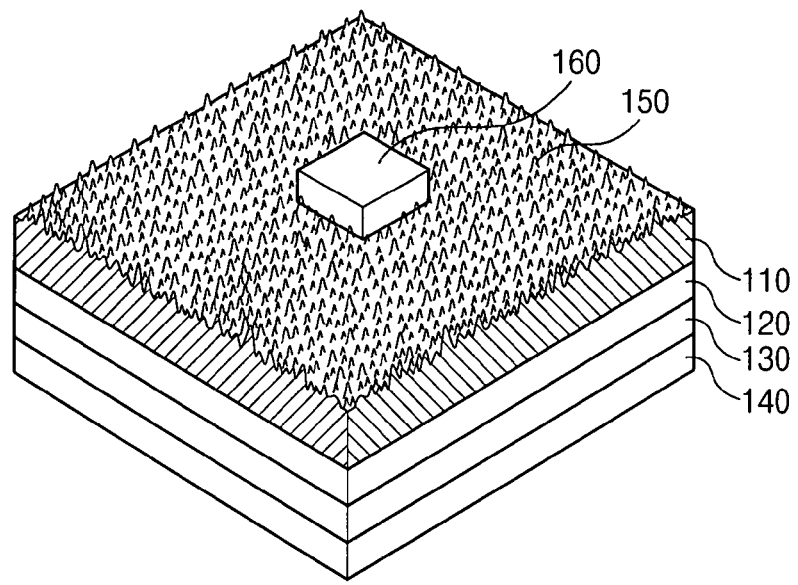
[FIG. 2]
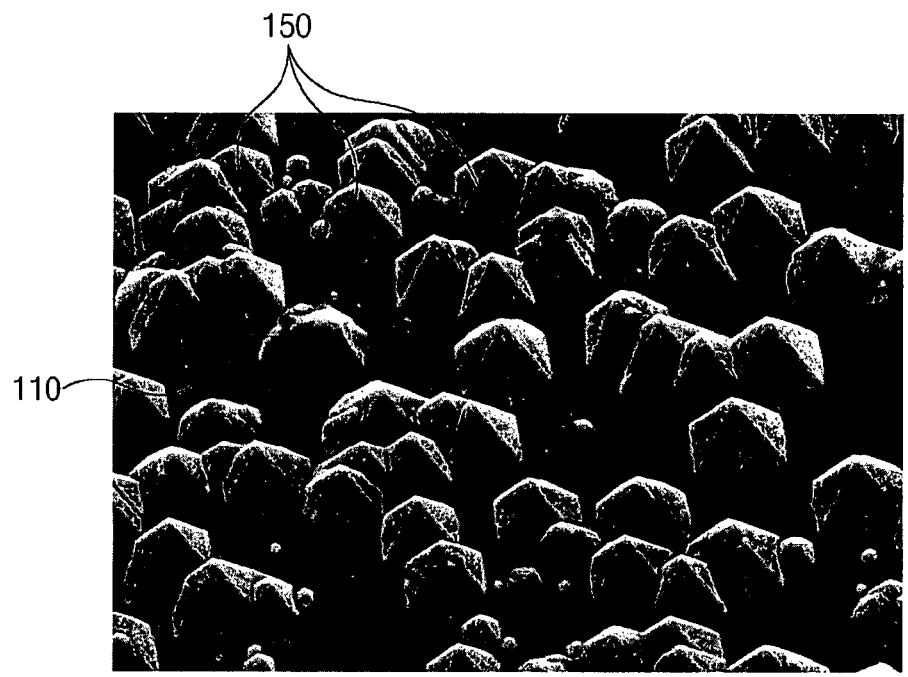

[FIG. 3]
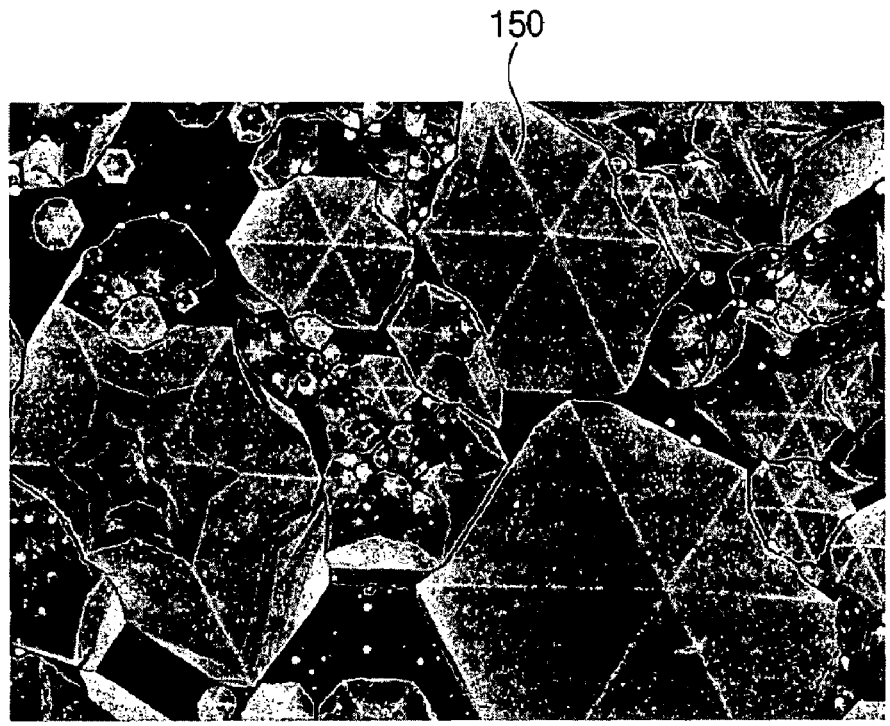
[FIG. 4A]
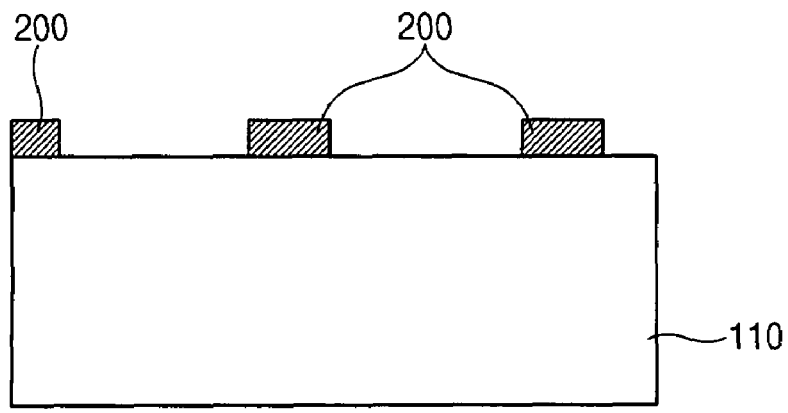
[FIG. 4B]
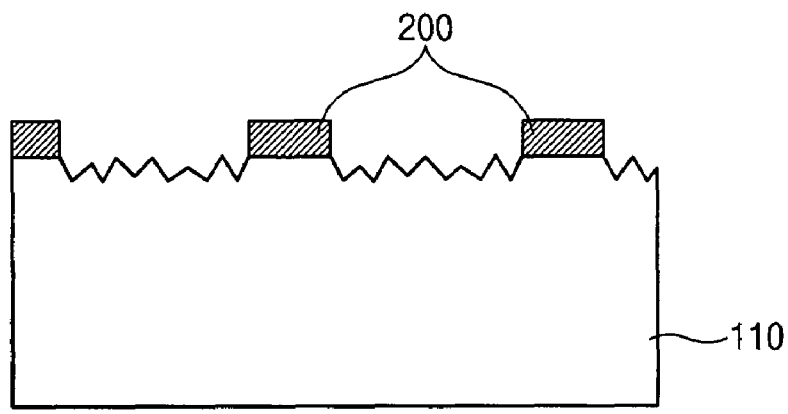

[FIG. 4C]
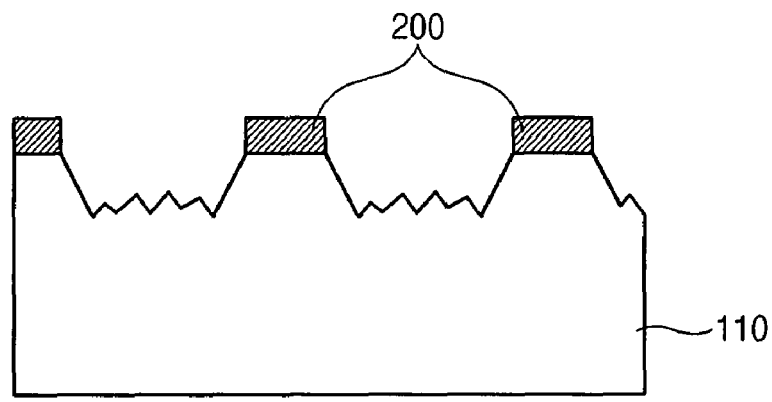
[FIG. 4D]
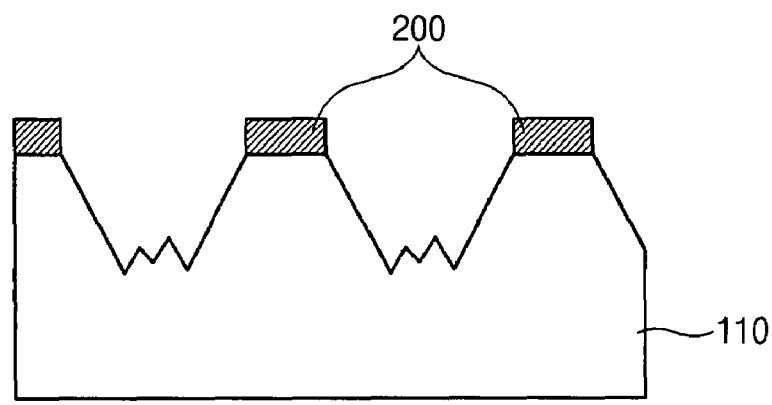
[FIG. 5]
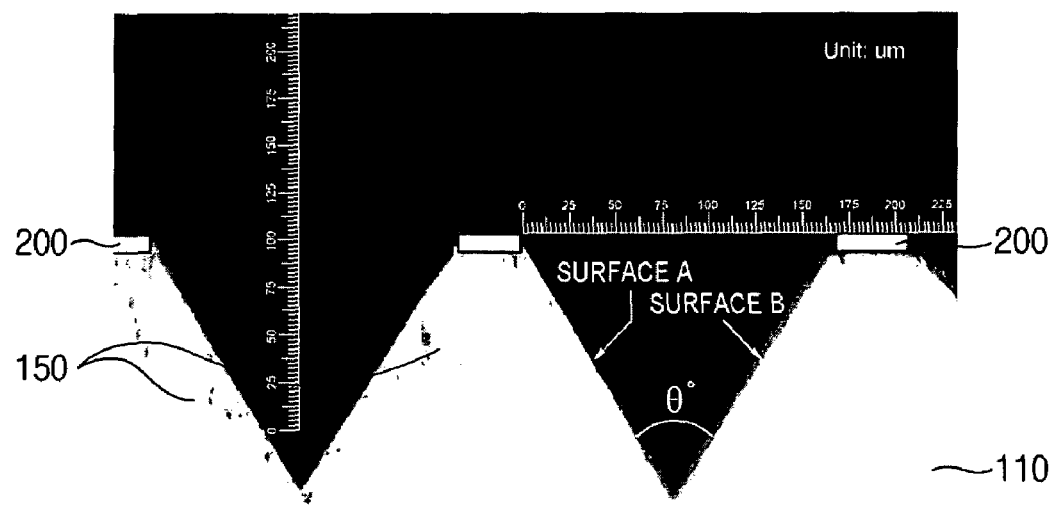

[FIG. 6]
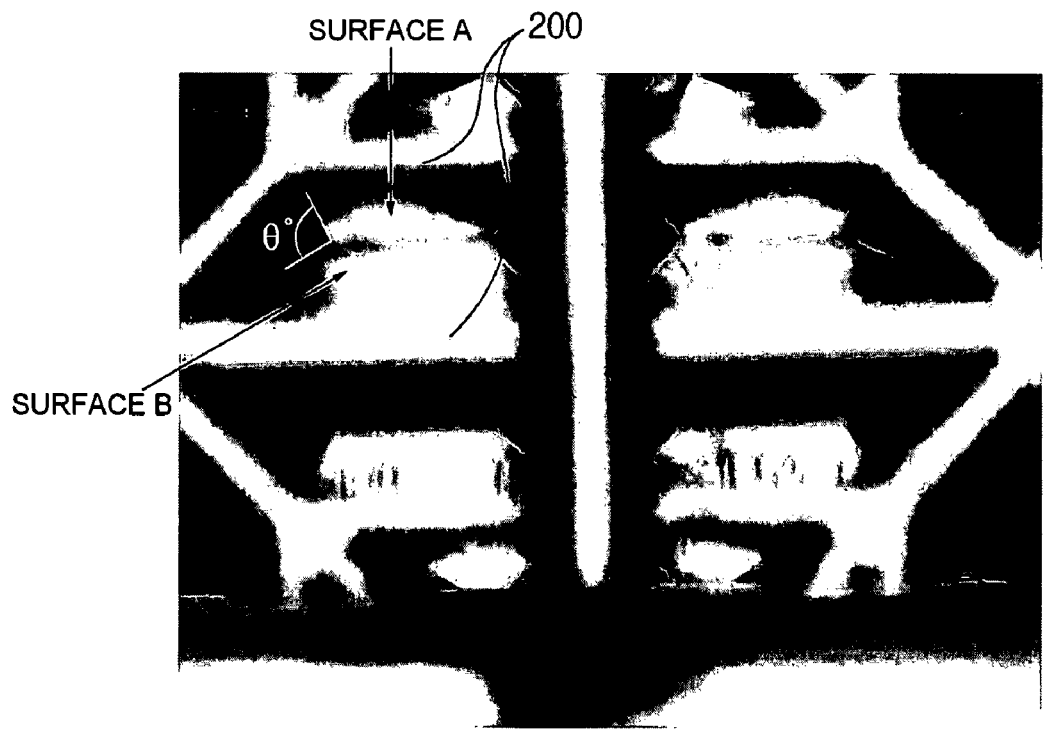
[FIG. 7]
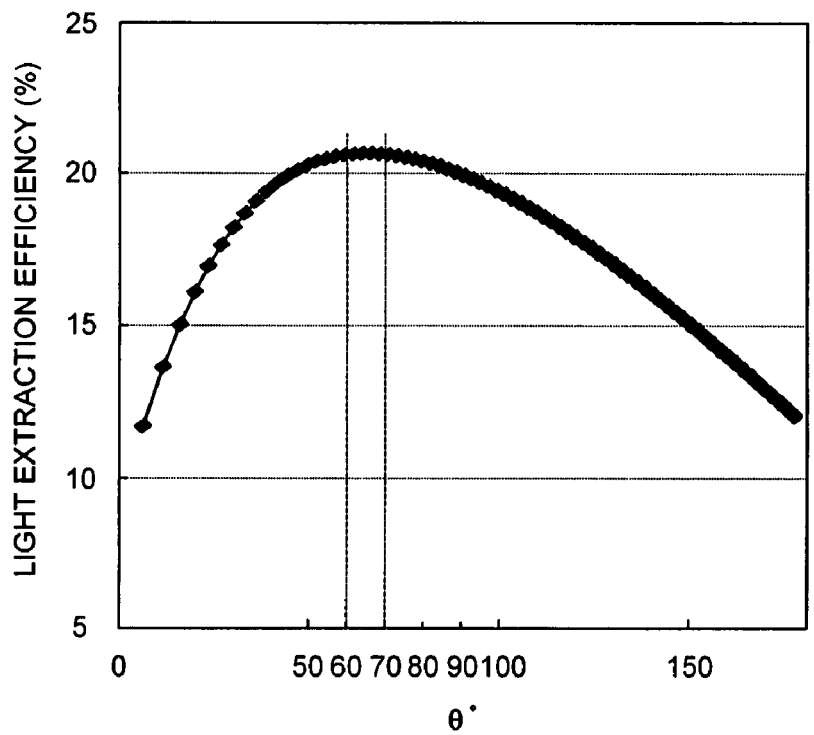

[FIG. 8]
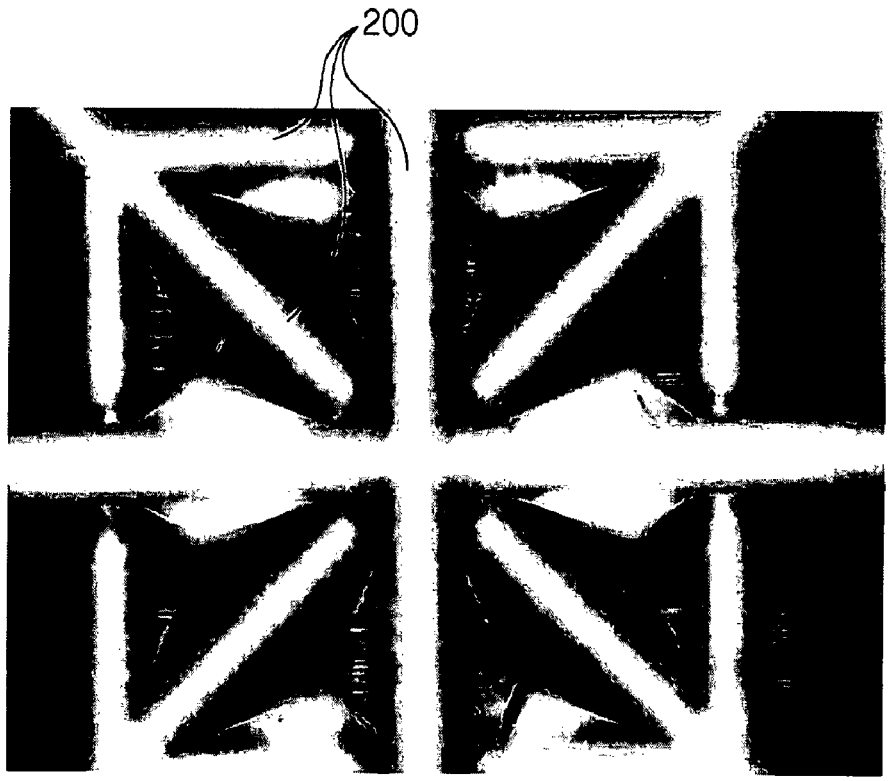
[FIG. 9]
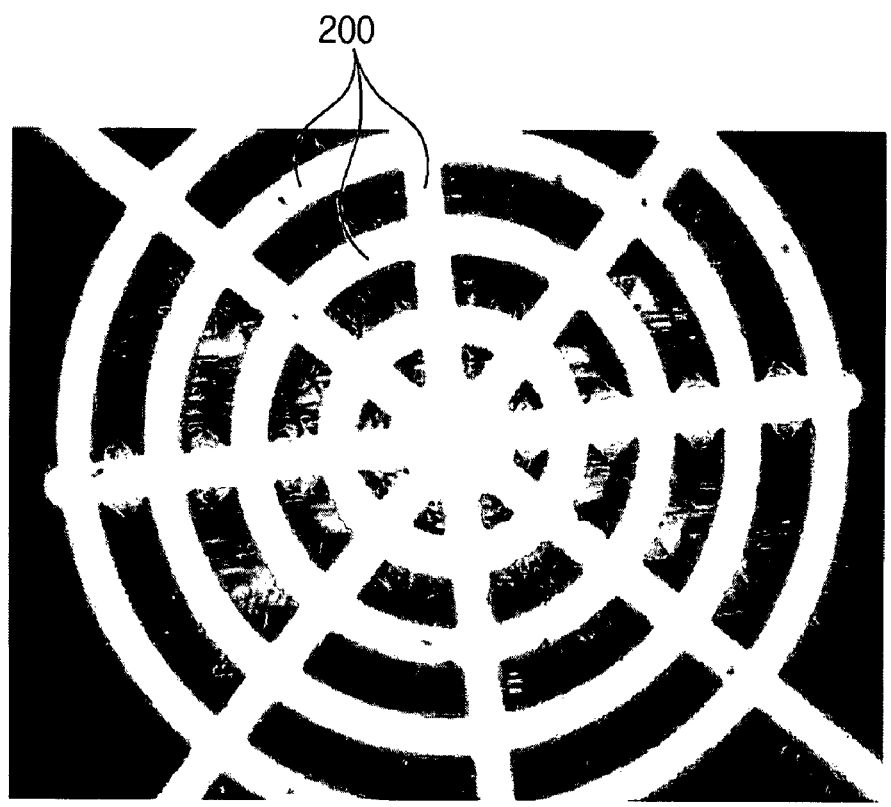

[FIG. 10A]
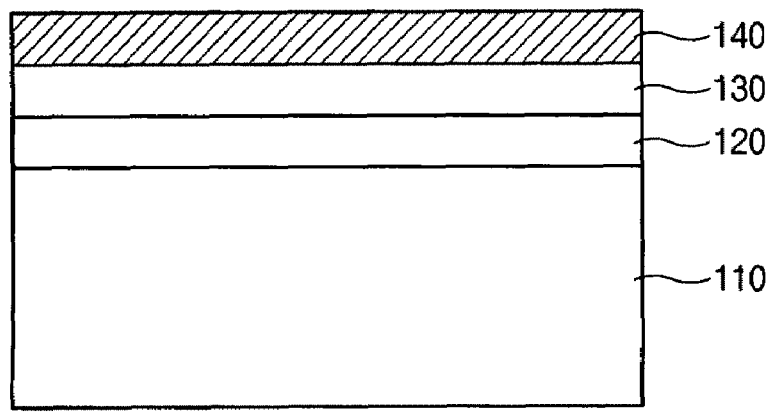
[FIG. 10B]
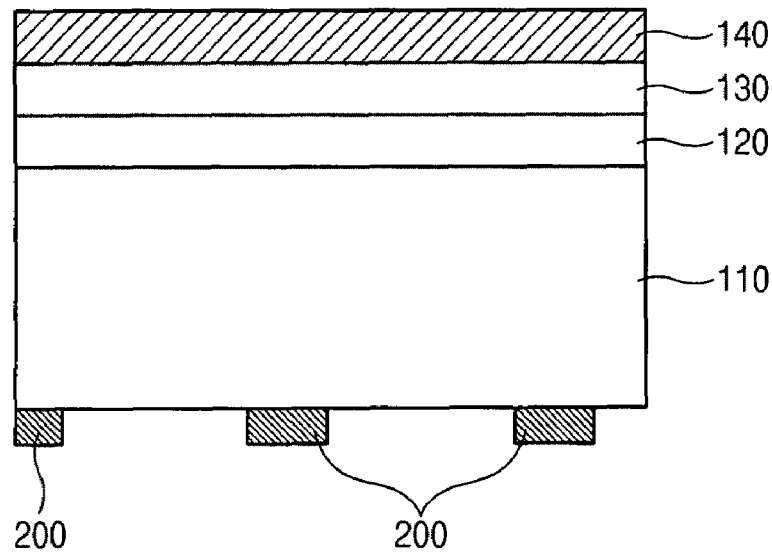
[FIG. 10C]
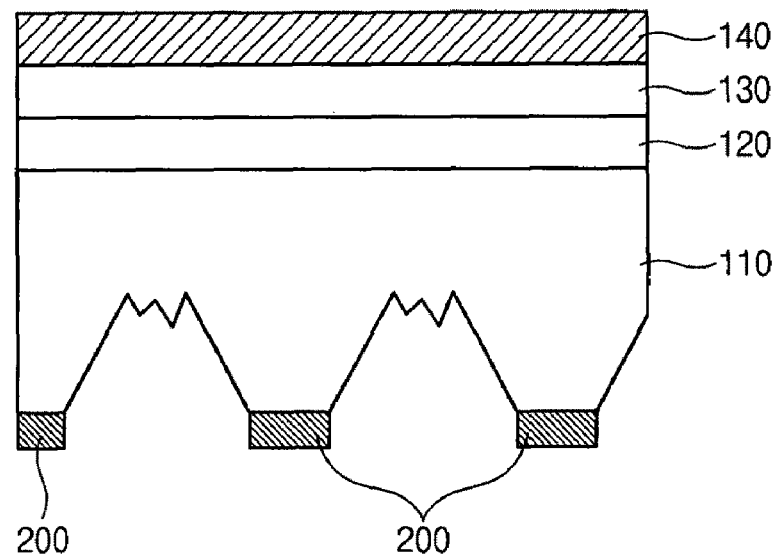

[FIG. 10D]
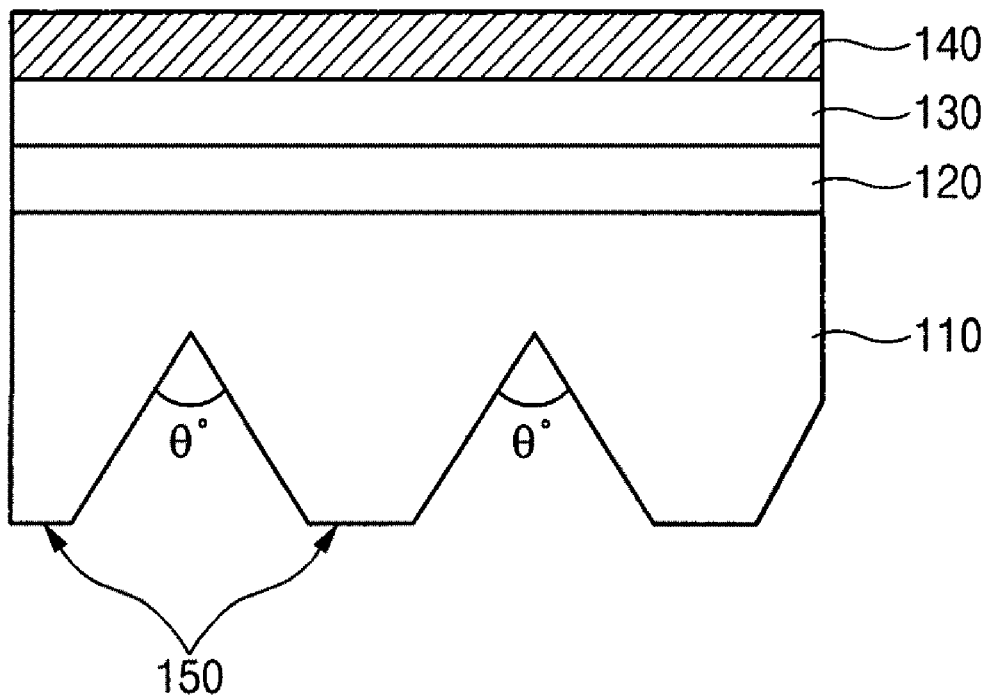
[FIG. 10E]
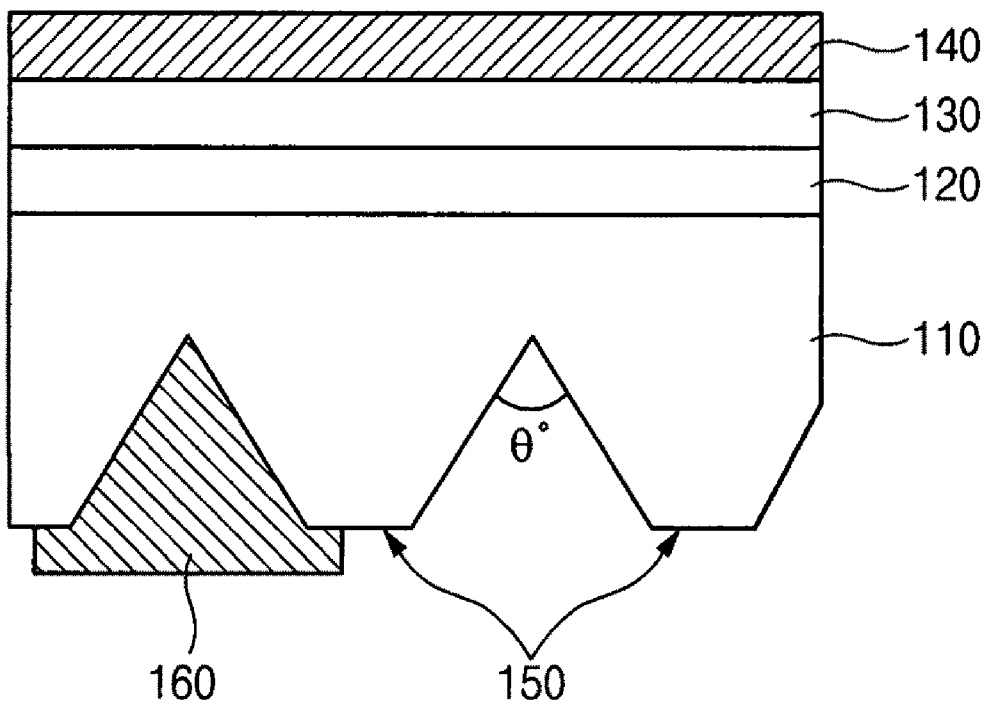

METHOD OF FORMING SURFACE IRREGULARITIES AND METHOD OF MANUFACTURING GALLIUM NITRIDE-BASED LIGHT EMITTING DIODE

CROSS-REFERENCE TO RELATED APPLICATIONS

This application claims the benefit of Korean Patent Application No. 10-2006-0077677 filed with the Korean Intellectual Property Office on Aug. 17, 2006, the disclosure of which is incorporated herein by reference.

BACKGROUND OF THE INVENTION

1. Field of the Invention

The present invention relates to a method of forming surface irregularities and a method of manufacturing a gallium nitride-based light emitting diode (hereinafter, referred to as a GaN-based LED), which can enhance light extraction efficiency of a vertical GaN-based LED using a GaN substrate.

2. Description of the Related Art

Generally, a GaN-based semiconductor LED is grown on a sapphire substrate, but the sapphire substrate is a rigid nonconductor and has poor thermal conductivity. Therefore, there is a limitation in reducing the manufacturing costs by decreasing the size of a GaN-based semiconductor LED, or improving the optical power and chip characteristic.

To solve this problem, there has been proposed a GaN-based LED using a GaN substrate with excellent conductivity and transmittance.

Such a GaN-based LED has surface irregularities formed on a light-emission surface, from which light is extracted, in order to enhance efficiency of light to be emitted from the GaN-based LED, that is, light extraction efficiency.

Now, a vertical GaN-based LED among conventional GaN-based LEDs using a GaN substrate will be described in detail with reference to FIG. 1. FIG. 1 is a perspective view of a conventional vertical GaN-based LED.

As shown in FIG. 1, the vertical GaN-based LED has a light-emission structure formed by sequentially forming an active layer 120 and a p-type nitride semiconductor layer 130 under a n-GaN substrate 110. Under the p-type nitride semiconductor layer 130, a positive electrode (p-electrode) 140 is formed. The n-GaN substrate 110 is formed to have a large thickness such that the active layer 120 and the p-type nitride semiconductor layer 130 are epitaxially grown and are supported by the n-GaN substrate 110.

The upper surface of the n-GaN substrate 110, that is, a light-emission surface of the light-emission structure has surface irregularities 150 for enhancing light extraction efficiency. On the surface irregularities 150, a negative electrode (n-electrode) 160 is formed.

The conventional vertical GaN-based LED employs the GaN substrate 110 having excellent conductivity and transmittance, instead of a sapphire substrate which is a rigid nonconductor and has poor thermal conductivity. Therefore, when the nitride semiconductor layers such as the active layer 120 and the p-type nitride semiconductor layer 130 are formed on the GaN substrate 110, lattice defects caused by growth can be minimized by the same lattice shape.

The GaN-based LED having the surface irregularities 150 operates as follows.

Holes injected through the p-electrode 140 spread laterally from the p-electrode 140. The holes are injected into the active layer 120 from the p-type nitride semiconductor layer 130. Electrons injected through the n-electrode 160 are injected into the active layer 120 from the n-GaN substrate 110. Then, the holes and the electrons are recombined in the active layer 120 so as to emit light. The light is emitted to the outside of the GaN-based LED through the surface irregularities 150 of the n-GaN substrate 110.

In order to minimize defects on the n-GaN substrate 110 serving as a light-emission surface, a wet-etching process is used to the surface irregularities 150 of the GaN-based LED, without using a dry-etching process where an occurrence rate of defects is high.

However, when the surface irregularities 150 are formed by using the wet-etching process, it is difficult to control the size and density of the surface irregularities 150, as shown in FIGS. 2 and 3.

FIGS. 2 and 3 are photographs for explaining the problems of the vertical GaN-based LED shown in FIG. 1. FIG. 2 shows a state where the density of the surface irregularities 150 is uneven. FIG. 3 shows a state where the sizes of the surface irregularities 150 are uneven.

As described above, when the sizes and density of the surface irregularities 150 are uneven, an improvement effect of light extraction efficiency is not enough.

Therefore, in this technical field, a new method is being required, which can minimize an occurrence rate of defects and maximize an improvement effect of light extraction efficiency.

SUMMARY OF THE INVENTION

An advantage of the present invention is that it provides a method of forming surface irregularities, which can form standardized surface irregularities on a GaN substrate by using a wet-etching process where an occurrence rate of defects is low.

Another advantage of the invention is that it provides a method of manufacturing a GaN-based LED which has standardized surface irregularities while a light-emission surface composed of a GaN substrate has a low occurrence rate of defects.

Additional aspect and advantages of the present general inventive concept will be set forth in part in the description which follows and, in part, will be obvious from the description, or may be learned by practice of the general inventive concept.

According to an aspect of the invention, a method of forming surface irregularities comprises preparing a GaN substrate; forming a mask on a surface of the GaN substrate, the mask defining a surface-irregularity formation region; and wet-etching portions of the surface of the GaN substrate by using the mask as an etching mask. The wet-etching of the GaN substrate is performed until the end of one surface of the GaN substrate to be formed by the wet-etching using the mask meets the end of another surface of the GaN substrate to be formed by the wet-etching using the mask, the another surface being adjacent to the one surface.

Preferably, when the end of one surface of the GaN substrate to be formed by the wet-etching using the mask meets the end of another surface of the GaN substrate to be formed by the wet-etching using the mask, an angle of 60 to 70 degrees is formed between the adjacent surfaces of the GaN substrate.

Preferably, the mask is formed of one or more materials selected from the group consisting of photoresist, $SiO_2$, SiN, Au, Cr, Ni, Pd, Pt, Cu, Ag, and Ti.

Preferably, the wet-etching is performed by using, as an etching solution, any one material selected from the group of a mixed solution, in which KOH and NaOH are mixed with $H_2O$ or ethylene glycol, $H_2SO_4$, and $H_3PO_4$.

Preferably, in the forming of the mask on the surface of the GaN substrate, the surface of the GaN substrate has N-polarity.

According to another aspect of the invention, a method of manufacturing a GaN-based light emitting diode (LED) comprises preparing a GaN substrate; sequentially forming an active layer and a p-type nitride semiconductor layer on a surface of the GaN substrate having Ga-polarity through an epitaxial growth method; forming a p-electrode on the p-type nitride semiconductor layer; forming a mask on a surface of the GaN substrate having N-polarity, the mask defining a surface-irregularity formation region; wet-etching portions of the surface of the GaN substrate having N-polarity by using the mask as an etching mask such that standardized surface irregularities are formed; and forming an n-electrode on the GaN substrate having the surface irregularities formed thereon. The wet-etching of the GaN substrate is performed until the end of one surface of the GaN substrate to be formed by the wet-etching using the mask meets the end of another surface of the GaN substrate to be formed by the wet-etching using the mask, the another surface being adjacent to the one surface.

Preferably, when the end of one surface of the GaN substrate to be formed by the wet-etching using the mask meets the end of another surface of the GaN substrate to be formed by the wet-etching using the mask, an angle of 60 to 70 degrees is formed between the adjacent surfaces of the GaN substrate.

Preferably, the mask is formed of one or more materials selected from the group of formed of photoresist, $SiO_2$, SiN, Au, Cr, Ni, Pd, Pt, Cu, Ag, and Ti.

Preferably, the wet-etching is performed by using, as an etching solution, any one material selected from the group of a mixed solution, in which KOH and NaOH are mixed with $H_2O$ or ethylene glycol, $H_2SO_4$, and $H_3PO_4$.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a perspective view of a conventional vertical GaN-based LED;

FIGS. 2 and 3 are photographs for explaining the problems of the vertical GaN-based LED shown in FIG. 1;

FIGS. 4A to 4D are sectional views sequentially showing a method of forming surface irregularities according to an embodiment of the invention;

FIG. 5 is a photograph showing the cross-section of surface irregularities manufactured according to the invention;

FIG. 6 is a photograph showing the irregularities manufactured according to the invention, seen from the top;

FIG. 7 is a graph showing changes in light extraction efficiency in accordance with changes in angle θ between the surface irregularities manufactured according to the invention;

FIGS. 8 and 9 are photographs showing modified examples of the surface irregularities shown in FIG. 6; and FIGS. 10A to 10E are sectional views sequentially showing a method of manufacturing a GaN-based LED according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, embodiments of the present invention will be described in detail with reference to the accompanying drawings.

Method of Forming Surface Irregularities

Referring to FIGS. 4A to 4D, 5, and 6, a method of forming surface irregularities according to an embodiment of the invention will be described in detail.

FIGS. 4A to 4D are sectional views sequentially showing a method of forming surface irregularities according to an embodiment of the invention, FIG. 5 is a photograph showing the cross-section of surface irregularities manufactured according to the invention, and FIG. 6 is a photograph showing the irregularities manufactured according to the invention, seen from the top.

As shown in FIG. 4A, first, a GaN substrate 110 is prepared. On a surface of the GaN-based substrate 110 having N-polarity, a mask 200 is formed, the mask 200 defining a surface-irregularity formation region. The mask 200 serves as an etching mask when an etching process for forming surface irregularities of the GaN-based substrate 110 is performed.

Accordingly, the mask 200 is preferably formed of a material having a lower etch rate than the GaN substrate 110. More specifically, the mask 200 is preferably formed of photoresist, $SiO_2$, SiN, Au, Cr, Ni, Pd, Pt, Cu, Ag, Ti or the like.

The size of the mask 200 can be changed depending on the size and density of surface irregularities to be formed.

Then, as shown in FIGS. 4B to 4D, portions of the surface of the GaN-based substrate 110 are wet-etched by using the mask 200 as an etching mask. As for an etching solution, a mixed solution, in which KOH and NaOH are mixed with $H_2O$ or ethylene glycol, $H_2SO_4$, and $H_3PO_4$ are preferably used.

Preferably, the wet-etching process is performed until the end of one surface of the GaN substrate 110 to be formed by the wet-etching using the mask 200 meets the end of another surface of the GaN substrate 110 to be formed by the wet-etching using the mask 200, the another surface being adjacent to the one surface.

Referring to FIGS. 5 and 6, when the end of one surface (indicated by a surface A) of the GaN substrate 110 to be formed by the wet-etching using the mask 200 meets the end of another surface (indicated by a surface B) of the GaN substrate 110 to be formed by the wet-etching using the mask 200, surface irregularities 150 having a V-shaped groove are formed with the surfaces A and B, the V-shaped groove forming an angle θ of 60 to 70 degrees.

When the surface irregularities 150 manufactured in such a manner are applied to a light-emission surface of an GaN-based LED, the light emission efficiency of the GaN-based LED can be maximized, because the surface irregularities 150 form an angle θ of 60 to 70 degrees therebetween. This can be clarified by referring to FIG. 7. FIG. 7 is a graph showing changes in light extraction efficiency in accordance with changes in angle θ between the surface irregularities manufactured according to the invention.

Therefore, although the surface irregularities 150 are formed by a wet-etching process in which defects are unlikely to occur, the size and density of the surface irregularities 150 can be easily controlled through the mask 200. That is, when the surface irregularities 150 are formed, an occurrence probability of defects can be minimized, and simultaneously, the size and density of the surface irregularities 150 can be standardized in accordance with a characteristic of an LED. Therefore, it is possible to provide a GaN-based LED which implements high luminance.

Further, the surface irregularities 150 can be formed to have a variety of shapes in accordance with the shape and size of the mask 200, as shown in FIGS. 8 and 9. That is, the surface irregularities 150 can be formed to have a variety of shapes depending on a characteristic of an LED. FIGS. 8 and 9 are photographs showing modified examples of the surface irregularities shown in FIG. 6.

Hereinafter, a method of manufacturing a GaN-based LED using the method of forming surface irregularities will be described with reference to the drawings.

Method of Manufacturing Gan-Based LED

Referring to FIGS. 10A to 10E, a method of manufacturing a GaN-based LED according to an embodiment of the invention will be described in detail.

FIGS. 10A to 10E are sectional views sequentially showing a method of manufacturing a GaN-based LED according to an embodiment of the invention.

As shown in FIG. 10A, a GaN substrate 110 is prepared, which has a lattice constant close to the lattice constant of a GaN-based semiconductor. The GaN substrate 110 is formed to have a large thickness such that a plurality of nitride semiconductor layers are epitaxially grown through the subsequent process and are then supported by the GaN substrate 100.

Then, an active layer 120 and a p-type nitride semiconductor layer 130 are sequentially formed on a surface of the GaN substrate 110 having Ga-polarity through an epitaxial growth process. The active layer 120 and the p-type nitride semiconductor layer 130 are formed of GaN-based semiconductor materials having a compositional formula of $Al_xIn_yGa_{(1-x-y)}N$ ($0 \leq x \leq 1$, $0 \leq y \leq 1$, and $0 \leq x+y \leq 1$), the GaN-based semiconductor materials having the same lattice shape a the GaN substrate 110. That is, in the invention, lattice defects among the GaN substrate 110, the active layer 120, and the p-type nitride semiconductor layer 130, caused by the epitaxial growth process, can be minimized so that the respective layers are formed to have excellent crystallinity. The active layer 120 can be formed with one quantum well structure or double-hetero structure, depending on a characteristic of an LED and a process condition.

In this embodiment, although not shown, an n-type nitride semiconductor layer having the same lattice shape as the GaN substrate 110 may be formed on the surface of the GaN substrate having Ga-polarity, before the active layer 120 and the p-type nitride semiconductor layer 130 are formed on the GaN substrate 110 (refer to FIG. 10A). Then, the doping concentration of the GaN substrate 110 is increased so that a current spreading effect can be enhanced.

Next, a p-electrode 140 is formed on the p-type nitride semiconductor layer 130. The p-type nitride semiconductor layer 130 has poorer conductivity than the GaN substrate 110. Further, the p-type nitride semiconductor layer 130 is formed to have a small thickness of less than 1 µm and has a characteristic close to p-n junction. Therefore, considering electrical and thermal characteristics, the p-electrode 140 may be formed such that an ohmic characteristic and an optical reflection characteristic are provided on the entire surface of the p-type nitride semiconductor layer 130. In other words, the p-electrode 140 may be composed of a single layer formed of metal having an ohmic characteristic and an optical reflection characteristic or may be composed of a multi-layer formed by laminating metal having an ohmic characteristic and metal having an optical reflection characteristic.

Continuously, a mask 200 defining a surface-irregularity formation region is formed on a surface of the GaN substrate 110 having N-polarity, as shown in FIG. 10. The mask 200 serves as an etching mask, when a subsequent etching process for forming surface irregularities of the GaN substrate 110 is performed.

Preferably, the mask 200 is formed of a material having a lower etch rate than the substrate 110. More specifically, the mask 200 is preferably formed of photoresist, $SiO_2$, SiN, Au, Cr, Ni, Pd, Pt, Cu, Ag, Ti or the like.

Further, the size of the mask 200 can be varied in accordance with the size and density of surface irregularities to be formed.

Then, as shown in FIG. 10C, portions of the surface of the GaN substrate 110 having N-polarity are wet-etched by using the mask 200 as an etching mask. As for an etching solution, a mixed solution, in which KOH and NaOH are mixed with $H_2O$ or ethylene glycol, $H_2SO_4$, and $H_3PO_4$ are preferably used.

The wet-etching is performed until the end of one surface of the GaN substrate 110 to be formed by the wet-etching using the mask 200 meets the end of another surface of the GaN substrate 110 to be formed by the wet-etching using the mask 200, the another surface being adjacent to the one surface. When the end of the one surface of the GaN substrate 110 to be formed by the wet-etching using the mask 200 meets the end of the another surface of the GaN substrate 110 to be formed by the wet-etching using the mask 200, surface irregularities 150 having a V-shaped groove are formed with the surfaces, as shown in FIG. 10D. The V-shaped groove forms an angle θ of 60 to 70 degrees.

Next, as shown in FIG. 10E, an n-electrode 160 is formed on the GaN substrate 110 having the surface irregularities 150 formed thereon. Preferably, the n-electrode 160 is formed of metal having an ohmic characteristic.

Then, subsequent processes such as a bonding process, a packaging process and the like are performed according to a typical method of manufacturing a GaN-based LED.

According to the invention, the wet-etching process using a mask is applied on the surface of the GaN substrate having N-polarity. Therefore, it is possible to minimize an occurrence rate of defects and to form standardized surface irregularities.

Further, the surface irregularities, which are standardized by controlling the size and density thereof in accordance with a characteristic of an LED, are formed on the light-emission surface of the LED using the GaN substrate. Then, it is possible to enhance light extraction efficiency.

Therefore, it is possible to provide a GaN-based LED which can implement high luminance.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a GaN-based light emitting diode (LED) comprising:

preparing a GaN substrate;

sequentially forming an active layer and a p-type nitride semiconductor layer on a surface of the GaN substrate having Ga-polarity through an epitaxial growth method;

forming a p-electrode on the p-type nitride semiconductor layer;

forming a mask on a surface of the GaN substrate having N-polarity, the mask defining a surface-irregularity formation region;

wet-etching portions of the second surface of the GaN substrate having N-polarity by using the mask as an etching mask such that standardized surface irregularities are formed; and forming an n-electrode on the GaN substrate having the surface irregularities formed thereon, wherein the wet-etching of the GaN substrate is performed until an end of one surface of the GaN substrate to be formed by the wet-etching using the mask meets an end of another surface of the GaN substrate to be formed by the wet-etching using the mask, the another surface being adjacent to the one surface, and wherein when the end of one surface of the GaN substrate to be formed by the wet-etching using the mask meets the end of another surface of the GaN substrate to be formed by the wet-etching using the mask, an angle of 60 to 70 degrees is formed between the adjacent surfaces of the GaN substrate.

2. The method according to claim 1, wherein the mask is formed of one or more materials selected from the group of formed of photoresist, $SiO_2$, SiN, Au, Cr, Ni, Pd, Pt, Cu, Ag, and Ti.

3. The method according to claim 1, wherein the wet-etching is performed by using, as an etching solution, any one material selected from the group of a mixed solution, in which KOH and NaOH are mixed with $H_2O$ or ethylene glycol, $H_2SO_4$, and $H_3PO_4$.

* * * * *